United States Patent
Baselmans et al.

(10) Patent No.: US 7,375,796 B2
(45) Date of Patent: May 20, 2008

(54) LITHOGRAPHIC APPARATUS AND DEVICE MANUFACTURING METHOD

(75) Inventors: Johannes Jacobus Matheus Baselmans, Oirschot (NL); Sjoerd Nicolaas Lambertus Donders, 's-Hertogenbosch (NL); Christiaan Alexander Hoogedam, Veldhoven (NL); Hans Jansen, Eindhoven (NL); Jeroen Johannes Sophia Maria Mertens, Duizel (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 81 days.

(21) Appl. No.: 11/092,964

(22) Filed: Mar. 30, 2005

(65) Prior Publication Data

US 2005/0219483 A1 Oct. 6, 2005

Related U.S. Application Data (63) Continuation-in-part of application No. 10/814,822, filed on Apr. 1, 2004, now Pat. No. 7,034,917.

(51) Int. Cl.
*G03B 27/42* (2006.01)
*G03B 27/54* (2006.01)
(52) U.S. Cl. .............................. 355/53; 355/67; 378/34
(58) Field of Classification Search .................. 355/53, 355/67
See application file for complete search history.

(56) References Cited

U.S. PATENT DOCUMENTS

| | | | |
|---|---|---|---|
| 3,573,975 A | 4/1971 | Dhaka et al. ................ 117/212 |
| 3,648,587 A | 3/1972 | Stevens ........................ 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,465,368 A | 8/1984 | Matsuura et al. | |
| 4,480,910 A | 11/1984 | Takanashi et al. ............ 355/30 |
| 4,509,852 A | 4/1985 | Tabarelli et al. ............. 355/30 |
| 5,040,020 A | 8/1991 | Rauschenbach et al. ...... 355/53 |
| 5,121,256 A | 6/1992 | Corle et al. ................. 359/664 |
| 5,528,118 A | 6/1996 | Lee | |
| 5,610,683 A | 3/1997 | Takahashi .................... 355/53 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—D. Rutledge
(74) *Attorney, Agent, or Firm*—Pillsbury Winthrop Shaw Pittman LLP (57) ABSTRACT

An immersion lithography apparatus is disclosed having a liquid supply system configured to at least partially fill a space between a final element of a projection system and a substrate table, with a first liquid, and a measurement system configured to measure a location of each of a plurality of points on the substrate, the measurement system being arranged such that measurements take place through a second liquid, the second liquid not being supplied by the liquid supply system.

31 Claims, 5 Drawing Sheets

U.S. PATENT DOCUMENTS

| | | | |
|---|---|---|---|
| 5,623,853 A | 4/1997 | Novak et al. | |
| 5,646,413 A | 7/1997 | Nishi | |
| 5,715,039 A | 2/1998 | Fukuda et al. | |
| 5,825,043 A * | 10/1998 | Suwa | 250/548 |
| 5,874,820 A | 2/1999 | Lee | |
| 5,900,354 A | 5/1999 | Batchelder | 430/395 |
| 5,969,441 A | 10/1999 | Loopstra et al. | |
| 6,191,429 B1 | 2/2001 | Suwa | 250/548 |
| 6,236,634 B1 | 5/2001 | Lee et al. | 369/112 |
| 6,262,796 B1 | 7/2001 | Loopstra et al. | |
| 6,400,441 B1 | 6/2002 | Nishi et al. | |
| 6,600,547 B2 | 7/2003 | Watson et al. | 355/30 |
| 6,603,130 B1 | 8/2003 | Bisschops et al. | 250/492.1 |
| 6,778,257 B2 | 8/2004 | Bleeker et al. | |
| 7,034,917 B2 | 4/2006 | Baselmans et al. | |
| 7,215,431 B2 * | 5/2007 | Opsal | 356/630 |
| 2002/0020821 A1 | 2/2002 | Van Santen et al. | 250/492 |
| 2002/0041377 A1 | 4/2002 | Hagiwara et al. | |
| 2002/0061469 A1 | 5/2002 | Tanaka | |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219482 A1 | 10/2005 | Baselmans et al. | |
| 2005/0219489 A1 | 10/2005 | Nei et al. | 355/53 |
| 2005/0233081 A1 | 10/2005 | Tokita | 427/256 |
| 2005/0280791 A1 * | 12/2005 | Nagasaka et al. | 355/53 |
| 2006/0126044 A1 * | 6/2006 | Mizutani et al. | 355/53 |
| 2007/0030467 A1 | 2/2007 | Horikawa | |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| FR | 2474708 | 7/1981 |
| JP | A 57-117238 | 7/1982 |
| JP | 58-202448 | 11/1983 |
| JP | A 59-19912 | 2/1984 |
| JP | A 61-44429 | 3/1986 |
| JP | 62-065326 | 3/1987 |
| JP | 62-121417 | 6/1987 |
| JP | 63-157419 | 6/1988 |
| JP | A 04-65603 | 3/1992 |
| JP | 04-305915 | 10/1992 |
| JP | 04-305917 | 10/1992 |
| JP | A 05-62877 | 3/1993 |
| JP | A 06-053120 | 2/1994 |
| JP | 06-124873 | 5/1994 |
| JP | A 06-188169 | 7/1994 |
| JP | 07-132262 | 5/1995 |
| JP | A 07-176468 | 7/1995 |
| JP | 07-220990 | 8/1995 |
| JP | A 08-37149 | 2/1996 |
| JP | A 08-316125 | 11/1996 |
| JP | A 08-330224 | 12/1996 |
| JP | A 10-163099 | 6/1998 |
| JP | 10-228661 | 8/1998 |
| JP | A 10-214783 | 8/1998 |
| JP | 10-255319 | 9/1998 |
| JP | 10-303114 | 11/1998 |
| JP | 10-340846 | 12/1998 |
| JP | A 11-16816 | 1/1999 |
| JP | 11-176727 | 7/1999 |
| JP | 2000-058436 | 2/2000 |
| JP | A 2000-505958 | 5/2000 |
| JP | 2001-091849 | 4/2001 |
| JP | A 2002-14005 | 1/2002 |
| JP | 2004-193252 | 7/2004 |
| JP | A 2004-247548 | 9/2004 |
| JP | A 2005-5713 | 1/2005 |
| JP | A 2005-86030 A | 3/2005 |
| WO | WO 99/49504 | 9/1999 |
| WO | WO 01/35168 A1 | 5/2001 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/015615 A1 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jun. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, *J. Microlith., Microfab., Microsyst.* 1(1):7-12 (2002).

Information Disclosure Statement filed Oct. 6, 2006 for U.S. Appl. No. 11/543,772.

\* cited by examiner

LITHOGRAPHIC APPARATUS AND DEVICE MANUFACTURING METHOD

CROSS REFERENCE TO RELATED APPLICATIONS

This application is a continuation-in-part of prior U.S. patent application Ser. No. 10/814,822, filed Apr. 1, 2004, now U.S. Pat. No. 7,034,917 entitled, Lithographic Apparatus, Device Manufacturing Method and Device Manufactured Thereby, which application is incorporated herein in its entirety by reference.

FIELD

The present invention relates to a lithographic apparatus, a device manufacturing method and a device manufactured thereby.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This may require additional or more powerful motors and turbulence in the liquid may lead to undesirable and unpredictable effects.

Figure 2:
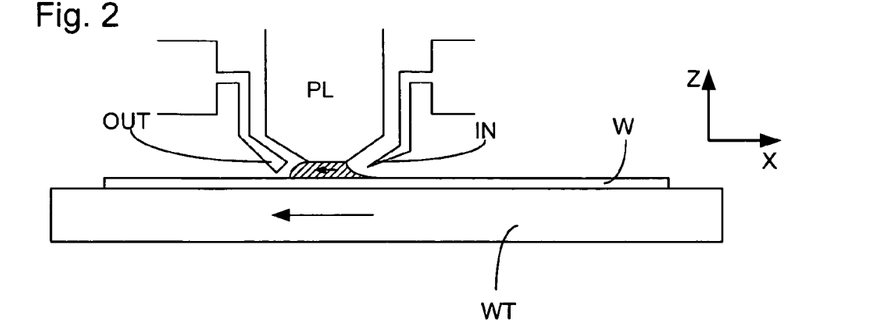
FIG. 2 is a liquid supply system according to an embodiment of the invention.
Figure 3:
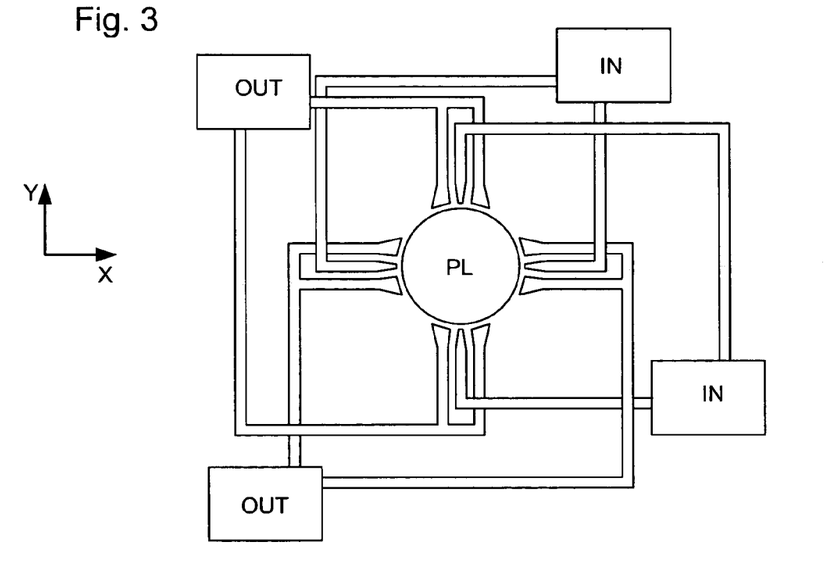
FIG. 3 is an alternative view of the liquid supply system of FIG. 2 according to an embodiment of the invention.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT Patent Application Publication No. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets situated around the final element are possible; one example is illustrated in FIG. 3 in which four sets of an inlet with an outlet on either side are provided in a regular pattern around the final element.

Prior to exposure, alignment and levelling of the substrate occurs. This may require complex and bulky apparatus. The apparatus involved in providing the immersion fluid can also be bulky and hence the arrangement of both the immersion apparatus and alignment and levelling apparatus can be difficult. Additionally, the refractive index through which exposure occurs could have a different refractive index from the surrounding area and thus alignment and levelling becomes more complex. Accurate alignment and levelling in immersion apparatus can therefore be difficult and problematic. Further, there may be residual liquid on the substrate leading to erroneous measurements if alignment and levelling takes place at a nearby "dry" environment.

SUMMARY

Accordingly, it would be advantageous, for example, to provide a lithographic projection apparatus in which focusing in immersion lithography apparatus is improved.

According to an aspect, there is provided a lithographic apparatus, comprising:

a substrate table configured to hold a substrate;

a projection system configured to project a patterned beam of radiation onto a target portion of the substrate;

a first liquid supply system configured to at least partially fill a space between a final element of the projection system and the substrate table, with a first liquid; and a measurement system configured to measure a location of each of a plurality of points on the substrate, the measurement system being arranged such that measurements take place through a second liquid, the second liquid not being supplied by the first liquid supply system.

As both measurement and exposure of the substrate occurs through immersion liquid there will be no errors due to a change in optical path lengths. Furthermore, if the measurements, e.g., levelling and alignment, take place through liquid the problems associated with residual liquid on the substrate may be avoided.

In an embodiment, the apparatus comprises a second liquid supply system configured to at least partially fill a space between the measurement system and the substrate table, with the second liquid. The first liquid supplied by the first liquid supply system and the second liquid supplied by the second liquid supply system may be the same type. This should help to eliminate errors due to differing refractive indices between the liquids.

In an embodiment, the measurement system comprises a level sensor configured to measure the height (i.e., measuring in the Z direction) and/or tilt (i.e. measuring in the $R_x$ and/or $R_y$ directions) of points on the substrate. For example, to measure the height of a point on the substrate, a beam could be projected through a grating, reflected by a point on the substrate and then projected through another grating. The degree of overlap of the images of the gratings indicates the height of the point on the substrate. The relative location of each of a plurality of points on the substrate could therefore be mapped through liquid before the substrate is exposed using the projection system.

According to an embodiment, the measurement system comprises an alignment system configured to measuring the positions (in the X, Y and/or $R_z$ directions) of a plurality of alignment marks on the substrate. An alignment sensor particularly suitable for use in immersion liquid is described in pending European patent application no. 03255395.0. The substrate may have a reference and the measurement system measures the location of the reference. In an embodiment, the location of each of a plurality of alignment marks is measured relative to the reference of the substrate table to enable a map of the alignment marks relative to the reference to be built up. In an embodiment, the reference comprises a transmission image sensor.

According to an embodiment, there is an exposure station and a separate measurement station, the projection system being provided at the exposure station and the measurement system being provided at the measurement station and the substrate table being moveable between the exposure and measurement stations. Furthermore there can be a plurality of substrate tables, each moveable between the exposure station and the measurement station. The substrate tables are designed to support the substrate and can incorporate a device for moving, or alternatively could be moved by another part of the apparatus such as a motor or mechanical arm.

In an embodiment, the projection station and the measurement station can be distinct i.e. a substrate cannot simultaneously be at the exposure station and the measurement station. While one substrate table is being mapped, a second substrate table can therefore be exposed. Substrate throughput is therefore higher, the apparatus more efficient and the cost of ownership improved.

In an embodiment, the alignment system measures displacement in two linear perpendicular directions and rotation within the plane defined by the two perpendicular directions.

In an embodiment, the first liquid supply system and the second liquid supply system have the same liquid source. This can ensure that the same immersion liquid is used for both the first and second liquid supply systems while both the exposure station and measurement station are supplied with fresh immersion liquid. Any variations in the quality or characteristics of the immersion liquid could therefore be uniform across both the measurement station and the exposure station. Relative errors in the optical path length between the measurement station and the exposure station could therefore be minimized. In an embodiment, the first and second liquid supply systems may be connected. For example, immersion liquid from the outlet of the liquid supply system supplying the measurement station could be supplied to the inlet of the liquid supply system supplying the exposure station.

According to an embodiment, the first liquid supply system and the second liquid supply system are separate. They do not have the same source and are not connected. Particular liquids may be beneficial for measurement, whereas other liquids may be suitable for use at the exposure station.

In an embodiment, the first liquid supply system comprises a liquid confinement structure extending along at least a part of the boundary of the space between the projection system and the substrate table. Furthermore, the second liquid supply system may comprise a liquid confinement structure extending along at least part of the boundary of the space between the measurement system and the substrate table. The liquid can therefore confined by the liquid confinement structure to a localized area and damage to the apparatus due to the immersion liquid could be minimized.

In an embodiment, the liquid confinement structure is actuatable in a direction substantially parallel to an optical axis of the projection system and/or parallel to an optical axis of the measurement system.

In an embodiment, the liquid supply system(s) comprises a seal configured to form a seal between the liquid confinement structure and the surface of the substrate. The seal may form a non-contact seal between the liquid confinement structure and the substrate table so that the liquid is contained in the space between the projection system and/or the measurement system, and the substrate table, even, for example, as the substrate moves under the projection system and/or measurement system, e.g., during measurement or a scanning exposure respectively. The seal may be a gas seal, a hydrostatic seal or a hydrodynamic seal.

The liquid confinement structure may be provided in the form of a closed loop, whether circular, rectangular, or other shape, around the space or maybe incomplete, e.g. forming a U-shape or even just extending along one side of the space. If the liquid confinement structure is incomplete, it should be situated to confine the liquid as the substrate is moved under the projection system and/or measurement system.

In an embodiment, the gap between the liquid confinement structure and the surface of the substrate inwardly of the seal is small so that capillary action draws liquid into the gap. Gas from a gas seal would also be prevented from entering the space. The balance between the capillary forces drawing liquid under the liquid confinement structure and the gas flow pushing out forms a particularly stable seal.

According to an aspect, there is provided a device manufacturing method, comprising:

measuring, through a first liquid, a location of each of a plurality of points on a substrate, the first liquid not being supplied by a liquid supply system configured to at least partially fill a space between the substrate and a final element of the projection system with a second liquid; and projecting a patterned beam of radiation, through second liquid supplied between the substrate and the projection system, onto a target portion of the substrate.

According to an aspect, there is provided a lithographic apparatus, comprising:

a substrate table configured to hold a substrate;

a projection system configured to project a patterned beam of radiation onto a target portion of the substrate, the projection system configured to project the patterned beam at an exposure station;

a measurement system configured to measure a location of each of a plurality of points on the substrate using a measurement beam, the measurement system configured to measure the location of each of the plurality of points at a measurement station displaced from the exposure station, the substrate table being movable between the exposure and measurement stations and arranged not to be simultaneously in the path of the projection beam and the measurement beam; and a liquid supply system configured to at least partially fill a space between a final element of the projection system and the substrate table and a space between a final element of the measurement system and the substrate table with a liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired location, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. For example, leveling measurements may be carried out at on one substrate table and exposure may be carried out at on another stage.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
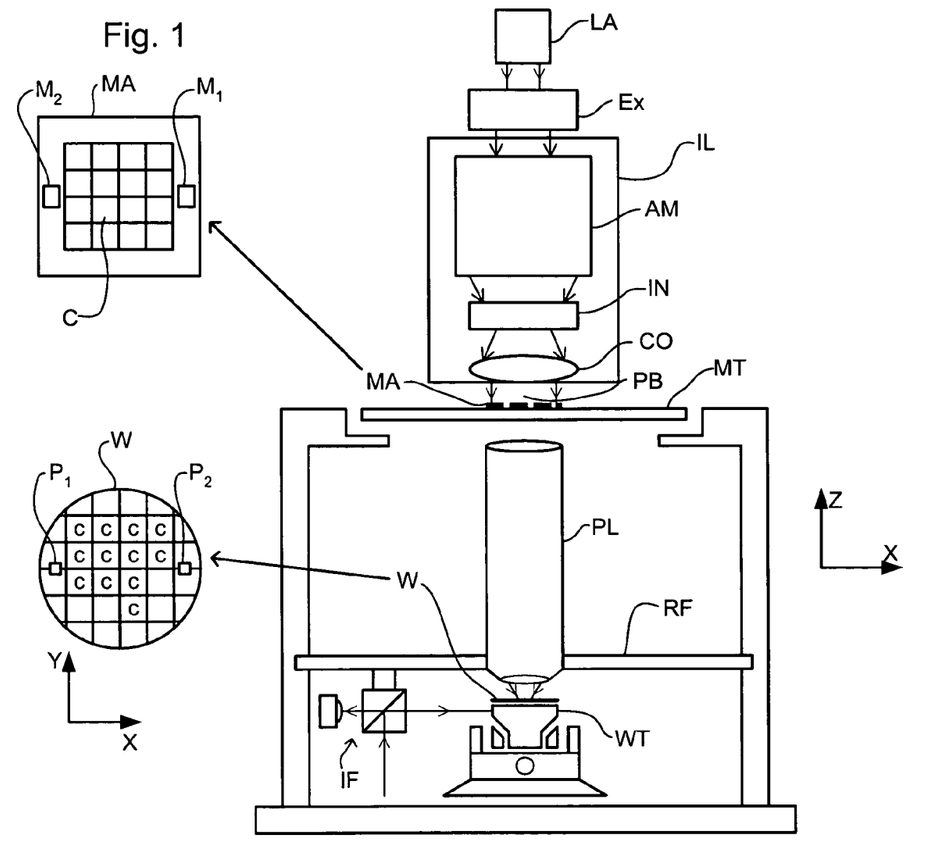
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and location sensor IF (e.g. an interferometric device), the substrate table WT can be moved accurately, e.g. so as to situate different target portions C in the path of the beam PB. Similarly, the first positioning device PM and another location sensor (which is not explicitly depicted in FIG. 1) can be used to accurately situate the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the length (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

An immersion lithography liquid supply system may be provided with a liquid confinement structure which extends along at least a part of a boundary of the space between an element of the projection system and the substrate table. The liquid confinement structure is substantially stationary relative to the projection system in the XY plane though there may be some relative movement in the X, Y or Z directions (where the Z direction is in the direction of the optical axis). A seal is formed between the liquid confinement structure and the surface of the substrate. In an embodiment, the seal is a contactless seal such as a gas seal. Such a system is disclosed in, for example, U.S. patent application Ser. No. 10/705,783, hereby incorporated in its entirety by reference.

Optical path lengths vary according to the refractive index of the medium through which the optical beam is travelling. Therefore, if a projection beam is being projected through an immersion liquid, the optical path length will differ from a similar beam being transmitted through a gas. If alignment and/or levelling measurement using a measurement beam occurs in a dry environment but exposure takes place through an immersion liquid then the difference in optical path lengths could cause alignment errors. Even if the difference in optical path length is compensated for, additional errors can occur if there is residual immersion liquid on the substrate when the substrate is being aligned and/or levelled for a second or subsequent time.

Figure 5:
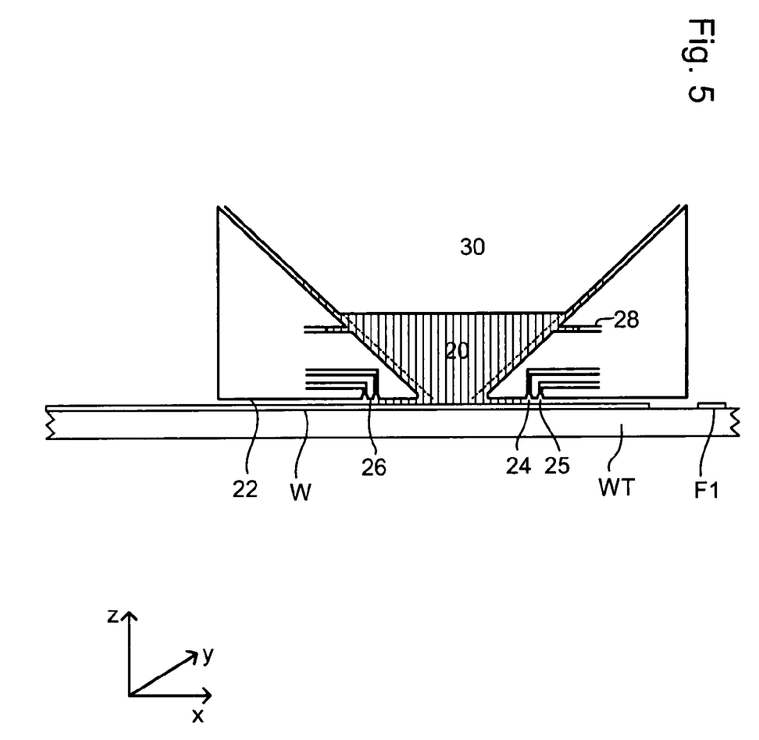
FIG. 5 depicts a detail of a lithographic projection apparatus according to an embodiment of the invention.

Accordingly, in an embodiment, a liquid supply port 28 is provided to allow supply of liquid (e.g. water) to a space between the measurement system 30 and the substrate table WT to form a liquid reservoir 20 as shown in FIG. 5. In this example, the reservoir 20 forms a contactless seal to the substrate around the image field of the measurement system 30 so that liquid is confined to fill a space between the substrate surface and a final element of the projection system 30. A liquid confinement structure 22, situated below and surrounding the final element of the measurement system 30, borders the reservoir 20 and comprises the liquid supply port 28. The liquid confinement structure 22 extends a little above the final element of the measurement system and has an inner periphery that at the upper end closely conforms to the shape of the measurement system or the final element thereof and may, e.g. be round. Liquid is bought into the space below the measurement system and within the liquid confinement structure 22 and the liquid level rises above the final element of the measurement system 30 so that a buffer of liquid is provided.

A gas seal 26, formed between the bottom of the liquid confinement structure 22 and the surface of the substrate W, confines the liquid in the reservoir. The gas seal is formed by gas, e.g. air, synthetic air, N$_2$ or an inert gas, provided under pressure via inlet 25 to the gap between liquid confinement structure 22 and the substrate W and extracted via first outlet 24. An over pressure on the gas inlet 25, vacuum level on the first outlet 24 and geometry of the gap are arranged so that there is a high-velocity airflow inwards that confines the liquid.

Alternatively, a hydrostatic bearing or hydrodynamic seal could be used instead of the gas seal 16. A hydrostatic bearing is described in U.S. patent application Ser. No. 10/873,647, filed Jun. 23, 2004.

Figure 7:
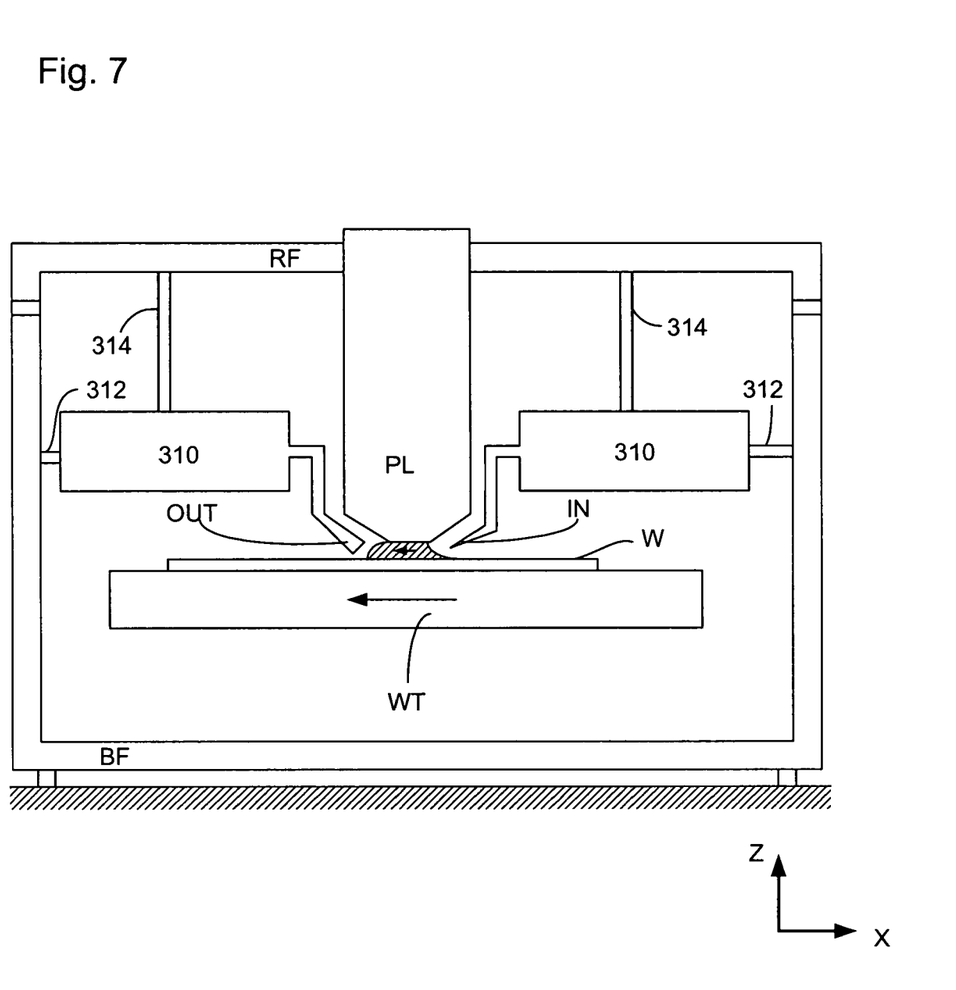
FIG. 7 depicts an actuatable liquid confinement structure according to an embodiment of the invention.

Further, a liquid confinement structure which is actuatable in at least the Z direction may be used in an embodiment of the present invention. For example, the inlets/outlets 14, 15, 24, 25 or one or more other inlets and/or outlets may be used, through control of fluid pressure, to move the liquid confinement structure in an axis substantially parallel to the optical axis (Z direction). Additionally or alternatively, referring to FIG. 7, liquid is supplied by at least one inlet IN and removed by at least one outlet OUT which make up a liquid confinement structure according to an embodiment of the invention. The liquid confinement structure 310, is positioned horizontally in the X-Y plane, parallel to the surface of the substrate, by supporting members 312 which connect the liquid confinement structure 310 to a base frame BF. Supporting members 312 may be actuators so that if the projection system moves in the X-Y plane, the liquid confinement structure can be held substantially stationary relative to the projection system PL in the X-Y plane. A further set of actuators 314 connected between the liquid confinement structure 310 and a reference frame RF that also supports the projection system PL. The actuators 314 control the position of the liquid confinement structure 310 in the Z direction, parallel to the optical axis of the projection system PL. However, the liquid confinement structure could be attached to only one of the reference RF and base BF frames, or both, and the functions of the connections to those frames could be reversed from what is described above. The actuators 314 can be piezoelectric, Lorentz motors, excenter mechanisms, linear (electrical, magnetic or a combination) or other actuators. In the situation where no signal is supplied to the actuators, the liquid confinement structure 310 is positioned above the substrate to reduce the risk of collision. A signal is supplied to the actuators to move the liquid confinement structure 310 closer to the surface of the substrate. The vertical movement possible is desirably of the order of several hundred microns. In use a feedforward or feedback control system controls the actuators 314 to maintain the liquid confinement structure 310 at a predetermined height above the surface of the substrate. This enables the clearance to be small if desired, enabling the liquid residue remaining on the substrate after scanning to be reduced without increasing the risk of collision. The actuators 314 can also be connected between the liquid confinement structure 310 and the projection system PL or the base frame BF. An actuatable liquid confinement structure for use in an embodiment of the invention is disclosed in more detail in U.S. patent application Ser. No. 10/844,575, filed May 13, 2004 (published as U.S. 2005-0007569), which is incorporated by reference herein in its entirety.

Once the reservoir 20 has been filled with liquid, alignment and/or level measurement can take place at the measurement station. The substrate table is provided with a reference F1, sometimes referred to as a fiducial, which may comprise a plate etched through with a pattern corresponding to a standard alignment mark underneath which is a radiation sensor, also known as a transmission image sensor, responsive to radiation. At the measurement station, the substrate table WT is moved to detect the reference F1 using an alignment system within the measurement system 30 and then to detect alignment marks on the substrate W thereby enabling the position (which as used herein, means in X, Y and/or $R_z$ directions) of the substrate alignment marks to be found. In an embodiment, the position of the alignment marks are measured and determined relative to the reference F1.

Level measurement of the substrate then occurs at the measurement station. In order to measure the level of the substrate, a levelling beam (projected from the measurement system 30) can be used that traverses a first grating prior to reflection by the substrate W. A second grating is then placed in the path of the levelling beam after reflection by the substrate W. The extent to which the images of the first and second gratings coincide is measured by a level measurement sensor and is determined by the height (which as used herein, means in the Z direction) and/or tilt (which as used herein, means in the $R_x$ and/or $R_y$ directions) of the substrate W. For a further description of level measurement of a substrate, reference is made to European patent application publication no. EP 1304597. Hence, using data from the alignment of the substrate and the level measurement of the substrate, a map of the substrate can be generated.

Figure 4:
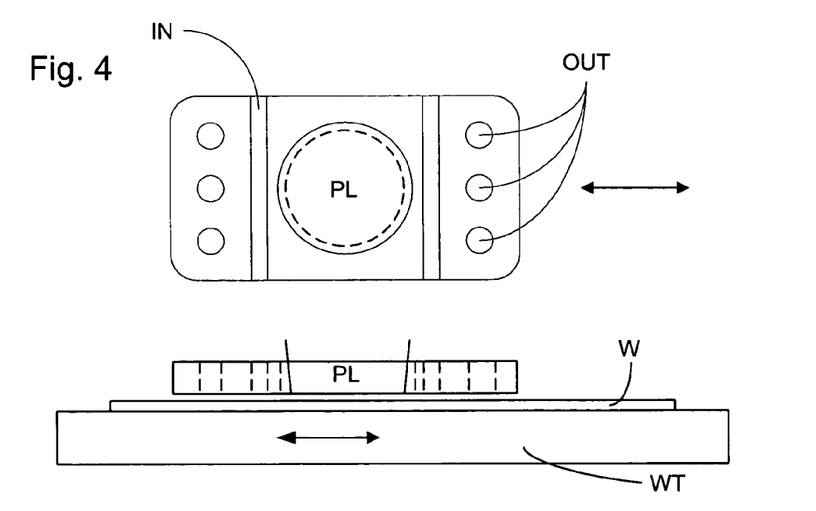
FIG. 4 depicts an alternative liquid supply system according to an embodiment of the invention.

Once measurement of the substrate W is completed the liquid reservoir 20 can be emptied, for example by reducing the gas inlet pressure and allowing the liquid to be sucked out by the vacuum system or, for example in the case shown in FIGS. 2, 3 and 4, by discontinuing the flow of liquid onto the substrate through inlet(s) IN and allowing the liquid to be sucked out by outlet(s) OUT.

Figure 6:
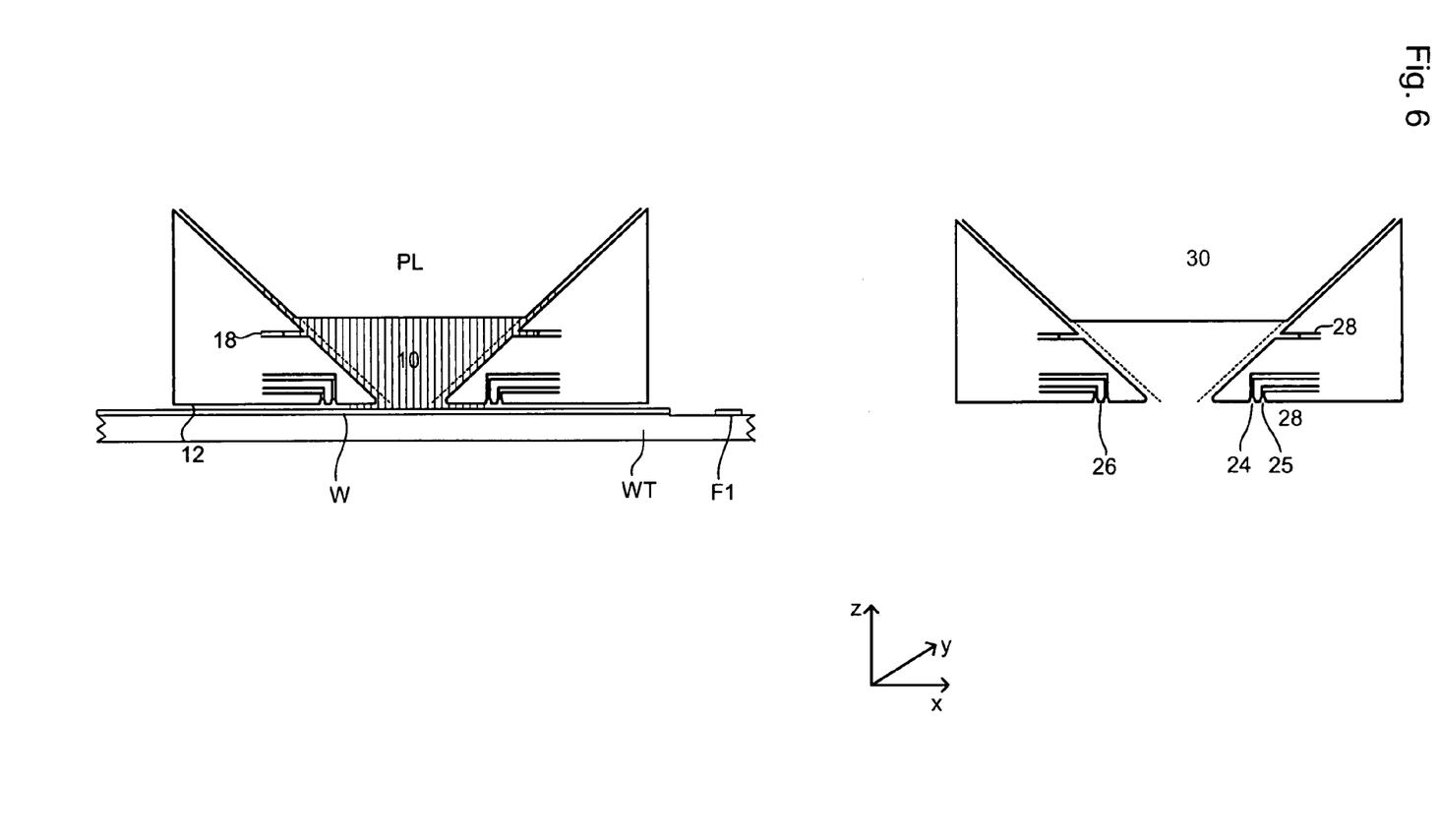
FIG. 6 depicts the same details of the lithographic projection apparatus as in FIG. 5 at a different stage in the exposure process according to an embodiment of the invention.

The substrate table WT is then moved to a separate exposure station as shown in FIG. 6. The exposure station has a similar liquid supply port 18 and liquid confinement structure 12 for containing the reservoir 10 as those at the measurement station. At the bottom of the liquid confinement structure 12, the inner periphery closely conforms to the shape of the image field, e.g., rectangular though this need not be the case. There is also a gas seal, with an inlet 15 and an outlet 14. Once the substrate table is at the exposure station, the liquid reservoir 10 is filled through the liquid supply port 18. To ascertain the exact location of the substrate table WT at the exposure station, the reference F1 is scanned in three dimensions through the aerial image of an alignment mark on the mask MA. The maximum signal is returned when the reference is aligned with the image of the mark on the mask in the plane of best focus. Using the map of the substrate W generated at the measurement station, the location (as used herein, the position, height and/or tilt) of each of a plurality of points on the substrate W are therefore known. In order to track the movements of the substrate table WT, a suitable location measurement device can be used such an interferometer beam projected towards one or more sides of the substrate table WT. A particular point on the substrate table can be placed at the focal point of the projection system PL and exposure of a target portion C of the substrate W can take place.

The liquid is then removed from reservoir 20 in a similar fashion to reservoir 10. The substrate can then be removed for further processing and a new substrate placed on substrate table WT. The substrate table with the new substrate can return to the measurement station and the process be repeated.

To ascertain the exact location of the substrate table WT, the location of the transmission image sensor described above can be sensed through liquid, or alternatively not through liquid and a correction applied.

According to an embodiment, there are at least two substrate tables, each bearing a reference, and while one substrate table is at the measurement station the other is at the exposure station. The substrate tables are moveable between the exposure station and the measurement station.

Instead of using the reference mark F1 and the projection system to align the substrate, off axis measurement can be used. The reference mark F1 can be aligned using another system near the projection system PL. Alternatively, a different reference and a different system, for example one with an axis perpendicular to the projection axis of the projection system can be used. Further description of such off-axis measurement can be found in European patent application publication EP 0906590.

The two liquid supply ports 18, 28 may be separate or may be connected (for example, have the same source). Liquid from the outlet of one reservoir may be the source for the liquid supply port of the other reservoir.

If the substrate table is above the projection system (i.e. the projection system is upside down compared to FIG. 1), the liquid in liquid reservoirs 10, 20 may not need to be completely removed and could just be refilled as necessary.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, hydrostatic, humidity, etc. may be used. Where a liquid other than water or an aqueous solution is used, terms such as hydrophilic, hydrophobic, etc. should be considered as referring to the similar proprieties of the liquid other than water or an aqueous solution.

While specific embodiments of the invention have been described above, it will be appreciated that the invention may be practiced otherwise than as described. The description is not intended to limit the invention.

The invention claimed is:

1. A lithographic apparatus, comprising:
a substrate table configured to hold a substrate;
a projection system configured to project a patterned beam of radiation onto a target portion of the substrate;
a first liquid supply system configured to at least partially fill a space between a final element of the projection system and the substrate table, with a first liquid; and
a measurement system configured to measure a location of each of a plurality of points on the substrate, the measurement system being arranged such that measurements take place through a second liquid, the second liquid not being supplied by the first liquid supply system.

2. The apparatus according to claim 1, further comprising a second liquid supply system configured to at least partially fill a space between a final element of the measurement system and the substrate table, with the second liquid.

3. The apparatus according to claim 2, wherein the first liquid supply system and the second liquid supply system have the same liquid source.

4. The apparatus according to claim 2, wherein the second liquid supply system comprises a liquid confinement structure extending along at least part of the boundary of the space between the measurement system and the substrate table.

5. The apparatus according to claim 4, wherein the second liquid supply system further comprises a seal configured to form a seal between the liquid confinement structure and the surface of the substrate.

6. The apparatus according to claim 5, wherein the seal is a gas seal, a hydrostatic seal or a hydrodynamic seal.

7. The apparatus according to claim 4, wherein the liquid confinement structure is actuatable in a direction substantially parallel to an optical axis of the measurement system.

8. The apparatus according to claim 1, wherein the first liquid supply system comprises a liquid confinement structure extending along at least a part of the boundary of the space between the projection system and the substrate table.

9. The apparatus according to claim 8, wherein the first liquid supply system further comprises a seal configured to form a seal between the liquid confinement structure and the surface of the substrate.

10. The apparatus according to claim 9, wherein the seal is a gas seal, a hydrostatic seal or a hydrodynamic seal.

11. The apparatus according to claim 8, wherein the liquid confinement structure is actuatable in a direction substantially parallel to an optical axis of the projection system.

12. The apparatus according to claim 1, wherein the measurement system comprises a level sensor configured to measure a height, tilt or both of each of a plurality of points on the substrate.

13. The apparatus according to claim 12, wherein the measurement system comprises an alignment system configured to measure a position of each of a plurality of alignment marks on the substrate.

14. The apparatus according to claim 1, wherein the measurement system comprises an alignment system configured to measure a position of each of a plurality of alignment marks on the substrate.

15. The apparatus according to claim 1, wherein the substrate table has a reference and the measurement system measures a location of the reference.

16. The apparatus according to claim 15, wherein the reference comprises a transmission image sensor.

17. The apparatus according to claim 15, wherein the measurement system is configured to measure a location of each of a plurality of alignment marks on the substrate relative to the reference of the substrate table.

18. The apparatus according to claim 1, comprising an exposure station and a separate measurement station, the projection system being provided at the exposure station and the measurement system being provided at the measurement station and the substrate table being movable between the exposure and measurement stations.

19. The apparatus according to claim 18, wherein the projection station and the measurement station are arranged such that a substrate cannot simultaneously be at the projection station and the measurement station.

20. The apparatus according to claim 18, comprising a plurality of substrate tables, each movable between an exposure station and a measurement station.

21. The apparatus according to claim 20, wherein the projection station and the measurement station are arranged such that a substrate cannot simultaneously be at the projection station and the measurement station.

22. A device manufacturing method, comprising:
measuring, through a first liquid, a location of each of a plurality of points on a substrate, the first liquid not being supplied by a liquid supply system configured to at least partially fill a space between the substrate and a final element of the projection system with a second liquid; and projecting a patterned beam of radiation, through second liquid supplied between the substrate and the projection system, onto a target portion of the substrate.

23. A lithographic apparatus, comprising:
a substrate table configured to hold a substrate;

a projection system configured to project a patterned beam of radiation onto a target portion of the substrate, the projection system configured to project the patterned beam at an exposure station;

a measurement system configured to measure a location of each of a plurality of points on the substrate using a measurement beam, the measurement system configured to measure the location of each of the plurality of points at a measurement station displaced from the exposure station, the substrate table being movable between the exposure and measurement stations and arranged not to be simultaneously in the path of the projection beam and the measurement beam; and a liquid supply system configured to at least partially fill a space between a final element of the projection system and the substrate table and a space between a final element of the measurement system and the substrate table with a liquid.

24. The apparatus according to claim 23, wherein the liquid supply system comprises a first liquid supply system configured to at least partially fill a space between a final element of the projection system and the substrate table and separate second liquid supply system configured to at least partially fill a space between a final element of the measurement system and the substrate table.

25. The apparatus according to claim 24, wherein the first liquid supply system is configured to supply a first liquid and the second liquid supply system is configured to supply a second liquid.

26. The apparatus according to claim 24, wherein the first liquid supply system and the second liquid supply system have the same liquid source.

27. The apparatus according to claim 24, wherein the first liquid supply system comprises a liquid confinement structure extending along at least part of the boundary of the space between the projection system and the substrate table and the second liquid supply system comprises a liquid confinement structure extending along at least part of the boundary of the space between the measurement system and the substrate table.

28. The apparatus according to claim 27, wherein the liquid confinement structure of the first liquid supply system is actuatable in a direction substantially parallel to an optical axis of the projection system and the liquid confinement structure of the second liquid supply system is actuatable in a direction substantially parallel to an optical axis of the measurement system.

29. The apparatus according to claim 23, comprising a plurality of substrate tables, each movable between the exposure station and the measurement station.

30. The apparatus according to claim 23, wherein the measurement system comprises an alignment system configured to measure a position of each of a plurality of alignment marks on the substrate.

31. The apparatus according to claim 30, wherein the measurement system comprises a level sensor configured to measure a height, tilt or both of each of a plurality of points on the substrate.

* * * * *

UNITED STATES PATENT AND TRADEMARK OFFICE
CERTIFICATE OF CORRECTION

PATENT NO.        : 7,375,796 B2
APPLICATION NO.   : 11/092964
DATED             : May 20, 2008
INVENTOR(S)       : Johannes Jacobus Matheus Baselmans et al.

It is certified that error appears in the above-identified patent and that said Letters Patent is hereby corrected as shown below:

On title page, item (75) Inventors:
replace "Christiaan Alexander Hoogedam"
with --Christiaan Alexander Hoogendam--.

Signed and Sealed this

Twenty-sixth Day of August, 2008

JON W. DUDAS
*Director of the United States Patent and Trademark Office*